United States Patent [19]

Slee

[11] Patent Number: 4,537,552

[45] Date of Patent: Aug. 27, 1985

[54] APPARATUS FOR FEEDING COMPONENTS TO A WORK STATION

[75] Inventor: Robert K. Slee, London, England

[73] Assignee: South London Electrical Equipment Company Limited, London, England

[21] Appl. No.: 535,951

[22] Filed: Sep. 26, 1983

[30] Foreign Application Priority Data

Jan. 14, 1983 [GB] United Kingdom ................. 8300960

[51] Int. Cl.³ .............................................. B65H 1/00
[52] U.S. Cl. .................................. 414/222; 414/502; 414/395
[58] Field of Search ............... 414/119, 222, 223, 749, 414/589, 395, 396, 331, 591, 349, 352, 373, 501, 502, 401; 269/56

[56] References Cited

U.S. PATENT DOCUMENTS

| | | | |
|---|---|---|---|
| 3,129,827 | 4/1964 | Hutter | 414/222 |
| 3,902,615 | 9/1975 | Levy et al. | 414/331 |
| 4,362,454 | 12/1982 | Kripzak | 414/331 X |
| 4,405,276 | 9/1983 | Wiegand | 414/119 |

FOREIGN PATENT DOCUMENTS 2551846 6/1977 Fed. Rep. of Germany ...... 414/117

Primary Examiner—Joseph E. Valenza
Assistant Examiner—Dennis Williamson
Attorney, Agent, or Firm—Pollock, Vande Sande and Priddy

[57] ABSTRACT

The apparatus is for feeding semi-conductor devices to and from process machines.

The apparatus includes a main frame 3 having a loading station 1 and an unloading station 2 each of which has a docking station for receiving carts 5. The carts are lifted by a jacking arrangement 40 into operative engagement with a loading or unloading system, 6 or 7 respectively, the loading/unloading means being movable relative to the main frame 3 when engaged by the cart, the movement of the loading means being detected by a fibre optic control system which initiates a signal to terminate lifting. In this way, a loading station of the cart is accurately aligned in three mutually perpendicular axes with the loading/unloading means to ensure reliable transfer of components from the carrier in the cart and a transfer conveyor by which the components are transferred to a machine for a processing operation or are transferred from the machine into an empty cart.

11 Claims, 9 Drawing Figures

APPARATUS FOR FEEDING COMPONENTS TO A WORK STATION

This invention relates to apparatus for feeding components to a work station and has particular but not exclusive application to feeding semi-conductor components to machines on an automated production line.

Such a production line will typically include machines which attach the semi-conductor devices or chip to a base, bond the electrical connections thereto, encapsulate the semi-conductor device in a metal can, and test the finished product. These various machines may operate at different speeds and to accommodate this the products supplied to each machine are located in a series of mobile storage carts which dock into each machine and deliver the components at a rate that each machine can accept. The carts thus provide a "buffer" between the successive machines in the production cycle. The movement of the components into and out of the machines is essentially a high speed operation in order to achieve a satisfactory rate of production.

The small size of the components being processed, coupled with the requirement for high speed operation, imposes severe problems in the handling of the components. Although the use of mobile storage carts solves the problem outlined above, that is, the problem caused by the different operating speeds of the various machines, the high speed transfer of components from carts to the machines generates additional problems, particularly in accurately aligning the carts with the part of the machine designed to receive the components. Similar problems occur in transferring components from machines into empty carts.

The necessity for accurate alignment is caused by the small size of the components being handled and the high speed required for the handling. To achieve the necessary speed of production the carts must be loaded and unloaded automatically and it is therefore necessary for the loading mechanism by which the components are transferred to and from the machines to be accurately located relative to the carts. Failure to provide accurate alignment causes frequent breakdowns of the machines, faulty loading and jamming of the components which can not only damage a large number of components but can also damage the machinery.

The present invention seeks to provide a solution to these problems. According to the present invention there is provided apparatus for loading components into or unloading components from a machine, including a main frame, a carrier for said components in the form of a cart movable into and out of a docking station in said main frame, loading means to transfer said components from the cart to said machine or from the machine to the cart, the loading means being movably mounted on said main frame, means to bring the loading means and the carrier into a cooperative relationship by relative movement therebetween, the loading means being movable relative to the main frame during said relative movement.

Preferably, the docking station has a latch arrangement engageable by the cart when docked to initiate said relative movement between the cart and the loading means.

Preferably, the cart is adapted to carry a plurality of component carriers each adapted to hold a plurality of components and being selectively movable to a loading station of the cart to enable the components in the carrier to be transferred by said loading means or from a machine into an empty carrier in the cart.

Preferably the component carriers are mounted in spaced parallel relationship on at least one drive chain or belt, in which case, the apparatus may include a carrier transport motor for moving the component carriers in the cart successively to the loading station, the motor being mounted on the main frame and being engageable when the cart is docked in the docking station through clutch means to drive means on the cart by which said end-less chain or belt is driven to move the component carriers.

One known method of feeding the components is to use a tube formed of extruded aluminium, the components being loaded into the tube, perhaps 20 in each tube, from where they are fed successively into a machine for an operation to be performed thereon. Since the tube is circumferentially closed, the components have to be pushed through the tube by a push rod located at the opposite end of the tube to the machine to which the components are being fed. Such an arrangement requires a great deal of space since the push rod must be at least as long as the tube itself. Further difficulty arises if the components should become jammed in the tube through shingling, i.e. riding up over adjacent components, or jamming in some other way. Being formed entirely of aluminium, the tubes are not very durable. Aluminium is also not entirely suitable for use with semi-conductor manufacture because of a lack of compatibility. Plastics materials have also been tried but have not proved successful. The present invention also seeks to overcome these disadvantages.

According to one aspect of the present invention there is provided an elongate carrier, particularly for use in the aforesaid apparatus for storing linearly a plurality of components to enable the components to be fed successively to a work station, the carrier having a base and guide elements thereon which define a guide path along which the components are movable, the guide elements including two pairs of opposed edge faces laterally spaced in a first plane, each pair having two edge faces a predetermined distance apart in a second plane normal to the first plane to thereby restrain movement of components positioned therebetween in the second plane, a third pair of opposed faces being spaced a predetermined distance apart in said first plane, to thereby restrain movement of the components in the first plane.

The term "plane" is used in a general sense and not in its strict geometric sense, and the term "normal" is also used in a general sense as the two planes may not be "normal" in the geometric sense, the requirement being that the restraint upon the components has components in the two directions to ensure that the components are always correctly orientated.

The base of the carrier may comprise spaced basic elements which may be formed of an aluminium extrusion but other suitable materials may be used, such as brass or even a synthetic plastics material. The guide elements are preferably formed of a high nickel stainless steel which is clean and compatible with semi-conductor devices.

Preferably, at least some of the opposed guide faces provide a point or line contact with the components being fed therealong to reduce frictional resistance to movement to a minimum. The dimensions between the guide faces are designed to maintain the components correctly orientated and to allow through movement whilst preventing the components shingling, i.e. riding up one on the other or otherwise jamming.

A preferred arrangement of the present invention will now be described, by way of example only, with reference to the accompanying informal drawings in which.

Figures 1, 7, 8:
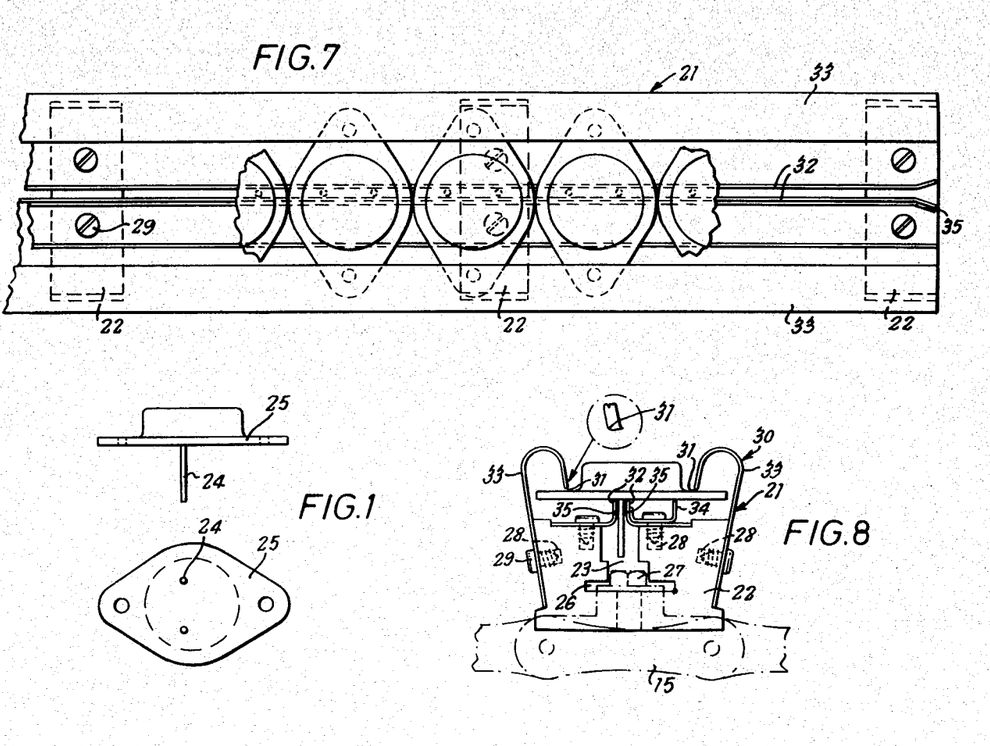
FIG. 1 shows details of a standard metal can encapsulated transistor device, reference TO-3 or To-66.
FIG. 7 shows a plan view of part of a component carrier
FIG. 8 shows an end view of the carrier of FIG. 7 having a transistor base located thereon.

Referring now to FIG. 1 there is shown the outline of a standard encapsulated transistor device bearing the JEDEC reference TO-3. The device has a base 25 and two pins 24. The embodiment of the present invention to be described is intended specifically for the manufacture and assembly of this device but it will be understood that the apparatus of the present invention may be modified to accommodate other components and is not to be regarded as limited to the manufacture of semiconductor devices.

In the manufacture of such devices, a plurality of steps are involved which require the transistor to be fed to a number of machines which include, inter alia, a machine for attaching the semi-conductor chip to the base, bonding the contact wires to the chip, encapsulating the chip in a protective metal can and testing the assembled component. These various machines operate at different speeds and therefore to have a fully automated production line the present invention provides a buffer between the various machines by means of mobile storage carts which can dock into each machine and deliver the components to the machine at a rate which the machine can accept.

Figure 2:
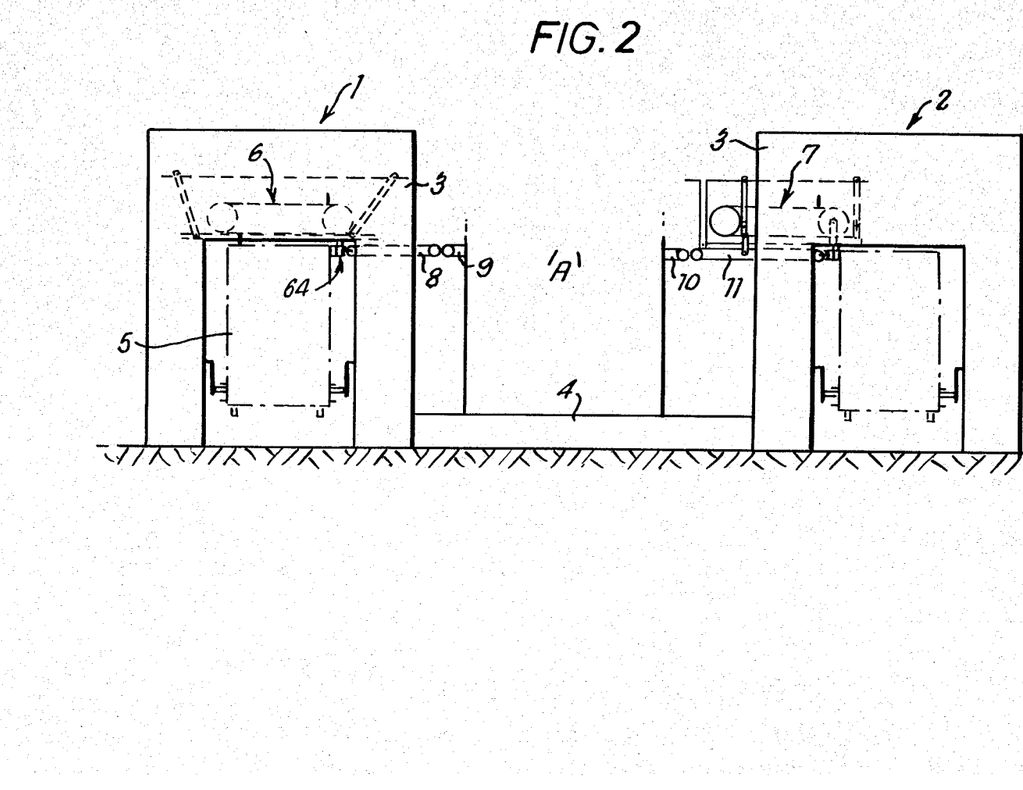
FIG. 2 shows a schematic view of apparatus in accordance with the present invention.

FIG. 2 shows a schematic arrangement of the present invention which shows a loading station, generally designated 1, and an unloading station, generally designated 2, in a main frame 3 which incorporates a platform 4 by which the two stations are connected. A machine which is adapted to receive the components for carrying out a process thereon is located in the space shown generally as reference A on the platform 4 between the loading and unloading stations. Since the machine itself does not form part of the present invention it will not be described further.

Components are supplied to the machine or removed from the machine in mobile storage carts 5 which are shown in outline only in FIG. 2, being described in greater detail in hereinafter with reference to FIGS. 3, 4 and 5. The carts shown in outline in FIG. 2 are shown in a raised position to be described hereinafter.

Loading means 6 is shown in FIG. 2 in outline and loading means 7 is shown in the unloading station 2. The loading means 6 incorporates a transfer conveyor 8 which is adapted to feed components onto a conveyor feed arrangement 9 of the machine A, whereas in the unloading station 2, the components are fed from an output conveyor 10 of the machine A which feeds components to a transfer conveyor 11 of the loading means 7.

Figure 3:
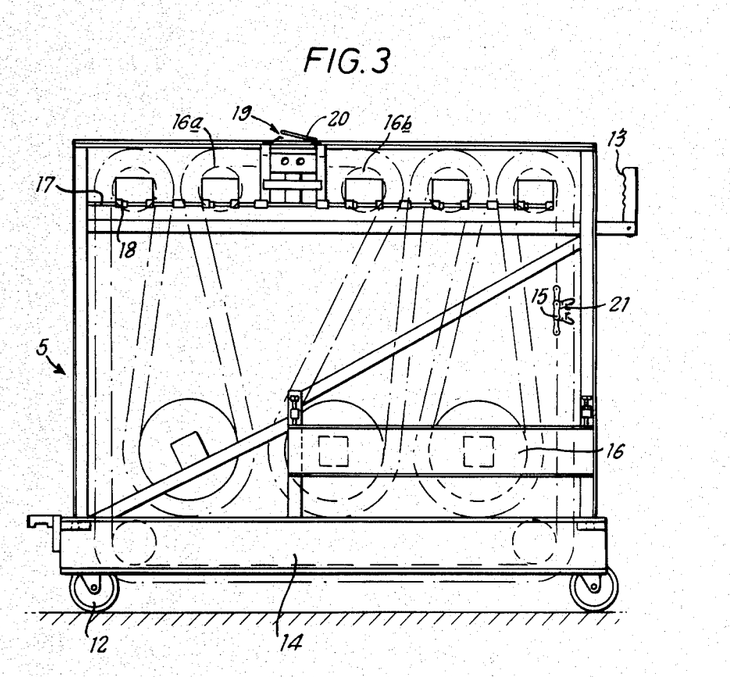
FIG. 3 shows a side view of a mobile storage cart.

FIG. 3 illustrates a view of a storage cart 5 which is of a generally rectangular box shape and is mounted on four castors 12. The cart is designed to be manually moved about and to assist this carries a pair of spaced handles 13 by which an operator is able to move the cart 5 into and out of the loading and/or unloading stations.

The cart 5 has a pair of side members 14 in the form of channel section members having their flanges projecting outwardly. The channel sections 14 are designed to ensure that the cart is accurately located in the apparatus and to ensure that the cart can be inserted into the apparatus in only the correct way, the channel section member are inclined inwardly when viewed in plan to provide a slight taper. The cart contains a pair of spaced parallel endless chains 15, shown in outline only, which run in a serpentine path round a plurality of gear wheels 16. The respective gears 16 on the two chains 15 are coupled together on common shafts. In the upper part of the cart 5 the chain 15 in following the serpentine path passes round five gears 16 which are drivingly connected together by a drive shaft 17 to which each gear 16 is connected by a worm gear arrangement 18. Two of the gears 16a and 16b are spaced apart to provide a straight path for the drive belts over a section of the cart at which a loading station 19 is provided. By driving the chains 15 through a plurality of gears a smooth transmission is provided. A plurality of component carriers 21 are mounted in spaced parallel on the two endless chains 15.

The top of the cart is closed except the loading station which includes a hinged lid 20 extending across the whole of the width of the cart. The apparatus incorporates a safety device (not shown) to prevent the loading means attempting to unload components from the cart if the lid 20 is closed. The details of the safety device are not shown but in one form is a fibre optic system incorporating a light-sensitive device and which emits a light signal. The light signal is reflected from a reflector on the lid to the light-sensitive device if the lid is in the closed position. The Light-sensitive device is adapted to switch off the loading means on receipt of a light signal reflected on the lid 20.

FIGS. 7 and 8 show a component carrier 21, which as shown in FIG. 7 comprises an elongate carrier known as a "tube", which may be from 50 to 60 cm long and which is designed to accommodate, perhaps, 20 TO-3 transistors. A plurality of these component carriers 21 are arranged in spaced parallel fashion in the storage cart 5 and are connected together by the endless conveyor chains 15 so that each carrier can, in turn, be brought to the loading or unloading station 19 in the cart to receive or discharge the components respectively. Typically each storage cart 5 has 150 carriers, thus, when the storage cart is docked with a machine, each carrier 21 is successively brought to the loading station where it is aligned with a component-receiving guide on the machine and the components are fed into the machine at a predetermined rate by means to be described hereinafter.

Referring now to FIGS. 7 and 8 in particular, the carrier 21 includes a base unit 22 formed of a plurality of short sections of an aluminium extrusion which has an opening 23 in its mid region which is designed to freely receive pins 24 of the transistor base 25. The openings 23 of the base sections adjacent each end of the carrier, have bores 26 by which the conveyor chains 15 can be secured to the carrier by means of a half-nut 27 designed to be a close fit in the opening 23. The base sections 22 include a plurality of channels 28 which receive self-tapping screws 29 by which stainless steel guide elements 30 are secured to the base 22.

The guide elements, which extend throughout the length of the carrier provide two pairs of opposed edge guide faces 31,32 which constrain the transistor base 25 against excessive movement in a first direction, the vertical direction, as shown in FIG. 8. The guide edges 31 and 32 of each pair are each formed on the edge face of an elongate strip of high nickel stainless steel. Each edge 31 is formed on an associated member 33 which comprises a U-shaped member secured by self-tapping screws 29 spaced along the length of the carrier 15 to the side edge of the base 22 so as to be inclined outwardly at a slight angle, typically 10° to the vertical. This inclination ensures satisfactory clearances for a component feeder unit but also enables visual inspection of the components being fed and also ensures that line contact is provided between the edge faces 31 and the transistor base 25. The guide elements 33 are sheared from a blank in such fashion that the burr which results on the "back" of the metal on shearing is maintained clear of the surface of the transistor base 25 to prevent scratching, as shown in the small circled scrap view of this section. The lower guide edge faces 32 are each provided on an end edge face of an L-shaped stainless steel element which, again, is secured to the base 22 by self-tapping screws 29. The vertical spacing between the edge guide faces 31 and 32 is such as to prevent the transistor bases "riding up" on each other to prevent jamming by what is known as "shingling". It is envisaged that this vertical dimension may be adjustable by providing the elements 33 with elongate slots at their fixing points to enable their position to be adjusted. As shown, a further stabiliser guide face 34 is provided on one side.

The components are located in the transverse direction by a further pair of opposed faces defined by the upstanding arms 35 of the L-shaped members carrying the guide edges 32. The lateral spacing between the inner faces of the arms 35 may be adjustable by providing the L-shaped members with elongate slots where they are secured to the base 22 by the self-tapping screws 29.

In this way, the transistor bses 25 are maintained in the correct orientation as they pass along the carrier and jamming is effectively prevented. The use of an extruded aluminium base and stainless steel guide elements enables the use of expensive material i.e. the stainless steel, for the parts of the carrier which contact the transistor, which has advantages inasmuch as the stainless steel is clean and compatible with the semi-conductor device, in a particularly economical manner. The arrangement also enables adjustment of the guide surfaces to accommodate the particular components being formed. The mounting of the carriers on the chains is such that if, for example, a carrier is damaged it can be removed for repair and its absence does not interfere with the operation of the apparatus.

As shown in FIG. 7, the slot formed between the two upstanding arms 35 may be flared out at the end of the carrier to facilitate feeding of the components to and from the carrier.

Figure 6:
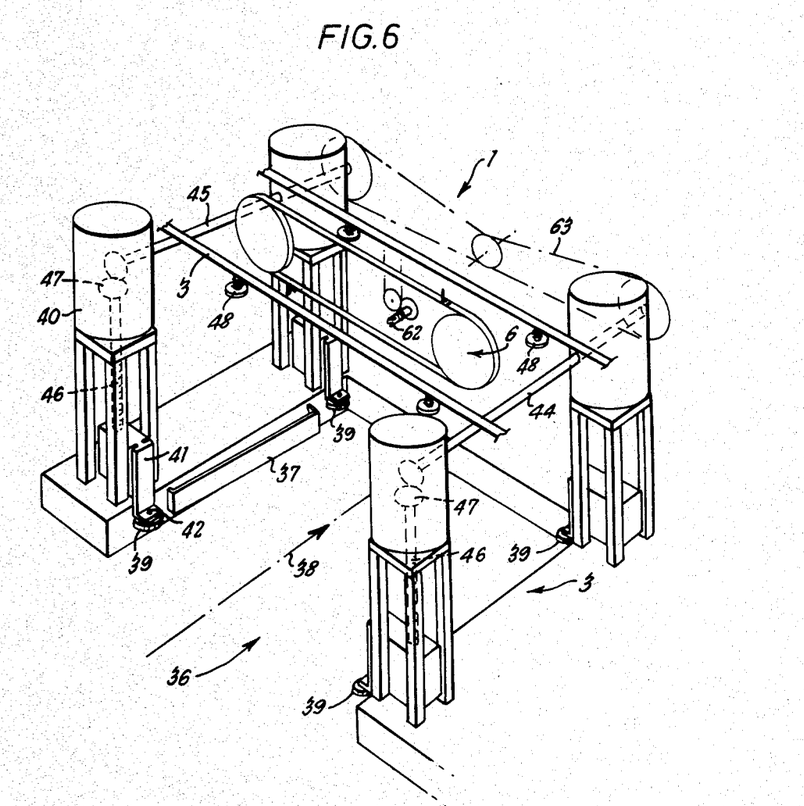

FIG. 6 shows a schematic perspective view of the loading station 1 illustrated in FIG. 1. The loading station includes a docking station 36 which is adapted to receive a cart 5. The docking station 36 includes a pair of guide rails 37 each inclined at a slight angle to the centre line 38 illustrating the direction in which a cart is pushed into the station, the rails 37 providing a slight taper to ensure that the cart is accurately guided into position. The tapered channel shaped guides 14 on each side of the cart 5 locate in rollers 39 which are connected to four jacks 40 which are designed to lift the cart 5 by its four corners. Each jack 40 has a lifting element 41 carrying the roller 39 and a pin 42 which locates in a corresponding recess in the respective corner of the cart 5 when the cart is accurately located in the docking station 36. Since the guides 14 are tapered the innermost pair of rollers 39 and pins 40 are slightly closer together so that it is impossible to dock the cart the wrong way round.

At its forward end, each cart 5 has a catch 43 which engages in a latch arrangement when the cart is fully docked in the docking station to initiate a lifting operation in which the cart is lifted by the jacks 40 into cooperative engagement with the loading means 6. Once the latch is engaged by catch 43 the operations of the lifting of the cart, unloading of the cart, and release of the cart is governed by a computorised control system, the details of which are not shown.

Once the catch 43 is engaged a motor, not shown, is started and the motor drives a bevel gear arrangement 47 in each of the jacks 40 through a pair of endless belts 62 which drive two drive shafts 44, 45 which in turn rotate lifting screws 46 through the bevel gear arrangements 47 shown in schematic outline form only. Rotation of the threaded screw rods 46 causes the lifting elements 41 to be raised, in lifting the cart to the position shown in FIG. 2, into engagement with the loading or unloading means respectively. As the cart is lifted, its upper surface into contact with four spaced stabilizer pads 48 which are resiliently mounted on the main frame 3 and serve to steady the top of the cart 5.

Figure 9:
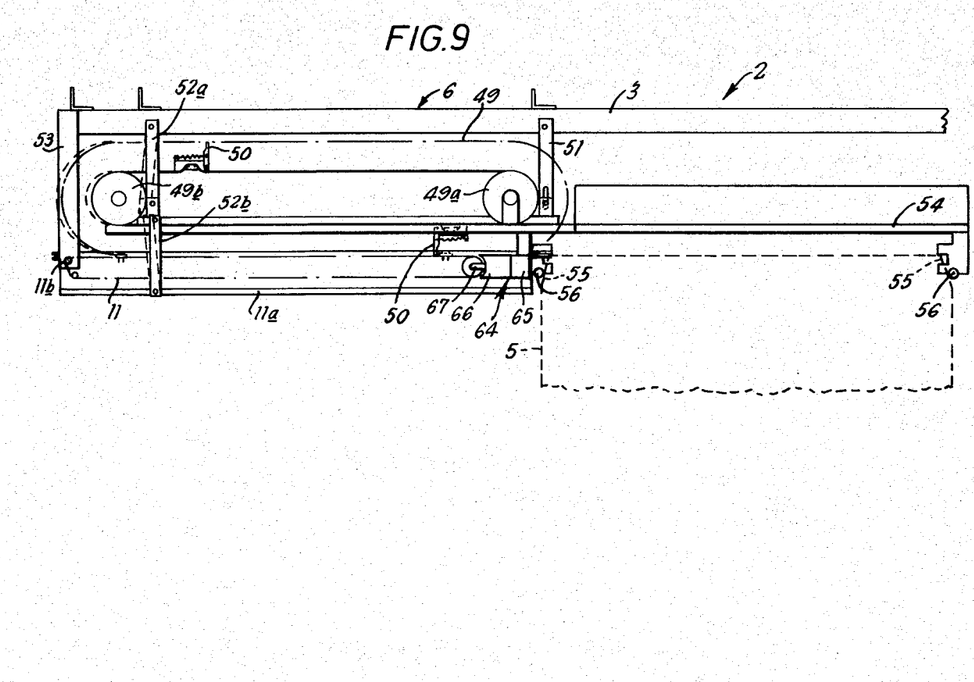
FIG. 9 shows a side view of the loading means at an unloading station.

As shown in FIGS. 6 and 9, the loading means whether at a loading station or unloading station is generally similar and incorporates an endless belt 49 which carries two resiliently loaded transport fingers 50 for transporting components. The endless belt 49 is supported on rollers 49a and 49b and is driven by a further motor (not shown) in a manner determined by the computorised control system.

FIG. 9 illustrates the form of the loading/unloading means for use at an unloading station in which components are received from a process machine and loaded into an empty cart. The loading means includes the conveyor belt arrangement 11 located immediately beneath the endless belt 49 carrying the fingers 50, for transferring the components from the conveyor 11 into the cart shown in outline. This arrangement is illustrated schematically on the right hand side of FIG. 2 as drawn.

Although not shown it is possible to provide a gating arrangement on the conveyor 11 with a normally closed gate adjacent its end nearest the cart which remains closed until a predetermined member of components are loaded onto the conveyor 11, and a second gate adjacent the input end of the conveyor 11 which is closed when said predetermined member of component have been loaded onto the conveyor and not opened until the components on the conveyor have been off-loaded.

The loading means 6 is connected to the main frame of the apparatus through a linkage arrangement by which a loading means frame member 54 which carries the conveyors. The linkage arrangement has a pin-jointed link 51 supporting the end of the frame member 54 intermediate its length. The lower pin joint on the link 51 is located in an elongated slot to thereby enable the loading apparatus to pivot upwardly relative to the main frame. The frame member 54 is pivotally connected to the main frame 3 and to the support 11a carrying the transfer conveyor 11 by respective pivotal links 52a and 52b. The input end of the support 11a is pivotably connected to the main frame 3 about a roller axis 11b thereof through a main frame member 53.

The end of the conveyor 11 closest to the cart terminates adjacent a telescopic section 64 having a telescopic upper surface designed to provide a component support surface which accommodates slight changes in position between the conveyor 11 and the cart 5 to enable the components to be passed smoothly into the cart 5.

The telescopic section 64 has one part 65 connected rigidly to the frame member 54 and a second part 66 connected to the end of the conveyor 11. The first part 65 is slidable mounted on a bar 67 connected to the pivot axis of the conveyor 11.

The arrangement is such that when the cart is lifted into engagement with the loading means, frame member 54 is able to move laterally on the two links 51 and 52a and is also, by virtue of the slots in the pin joints of link 51 to pivot upwardly. The conveyor 11 is able to pivot about the axis 11b and any variation between the movement of the conveyor 11 and the frame member 54 (and hence the endles belt 49) is accommodated by the telescopic section 64. In this way, the desired position of the loading fingers 50 relative to the cart is maintained. At the loading station 1 shown in FIG. 6, the loading means is essentially similar except that the positions of the cart 5 and the transfer conveyor belt 8 relative to the endless belt 49 are transposed and the support linkage is slightly modified.

In this station the cart 5 is guided into position under the endless belt 49 and the belt 49 is mounted on a pin-jointed trapezoidal linkage shown in outline in FIG. 2 which is designed to accommodate any slight angularity of the cart relative to the loading means. The conveyor 11 and the telescopic section 64 connect the cart and the endless belt to the machine which is to receive the components.

The transfer conveyors 8,11 each comprise a pair of endless conveyor belts in parallel and spaced apart so that their support surfaces support the bases 25 of the components with the pins 24 depending between the two belts so that the components remain aligned with the position shown in FIG. 8.

Figure 4:
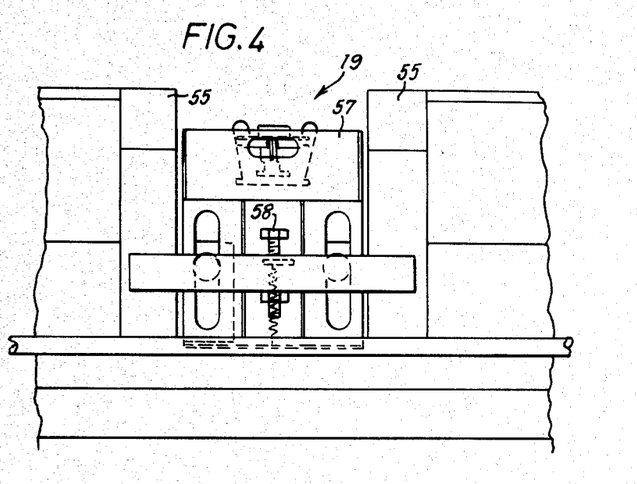
FIG. 4 shows detail of a loading station of the cart shown in FIG. 3.
Figure 5:
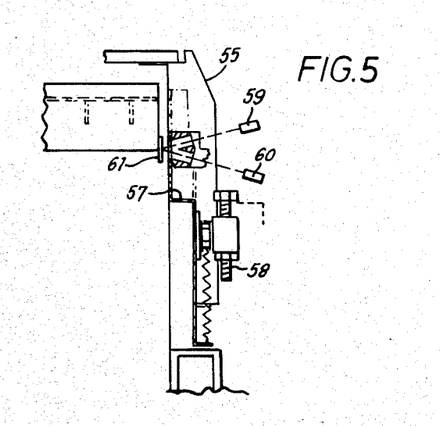
FIG. 5 shows a detail end view of part of the loading station, FIG. 6 a schematic perspective view of a loading station.

Referring now also to FIGS. 4 and 5 there is shown part of the loading station of a cart 5, FIG. 4 being part of the side view as shown in FIG. 3 and FIG. 5 being an end view. As can be seen, the cart at the loading station 19 includes on each side of the cart a pair of inclined guide surfaces 55 which are also shown schematically in FIG. 9. When the cart 5 is lifted by the jacks 40, the guide surfaces 55 engage with rollers 56 located on a frame member 54 of the loading means to thereby adjust the loading means to the cart by means of the telescopic adjustment on the conveyor end. As the cart 5 engages the loading means, an abutment on the loading means engages a spring loaded shutter 57 on the cart and pushes it downwardly relative to the remainder of the cart against the spring bias. The shutter 57 is normally biased upwardly to the position shown in FIG. 4 to prevent the components accidentally falling out of the component carrier 21.

As the cart 5 is raised by the jacks 40 it engages the loading means and lifts the loading means slightly and this movement of the loading means is detected by a fibre-optic sensing device (not shown) which sends a signal to the computer which thereupon switches off the motor operating the jacks 40 to terminate lifting. A back-up micro-switch is provided to switch off the motor should the fibre optics device fail to operate. The lost motion of the loading means means that the loading means "rests" on the cart and therefore by the provision of an adjusting arrangement, shown schematically as a bolt with a lock nut 58 in FIGS. 4 and 5, the position of the cart relative to the loading means, in particular the conveyor 11 can be accurately set. In this way variations in the size of the cart, the workshop floor and the various other tolerances in the apparatus and differences between carts can readily be accommodated to ensure that the carrier in the loading station 19 of a cart is accurately aligned, in height, with the component bearing surface of the conveyor 11.

The position of the component carrier 21 in the loading station 19 of the cart 5 is also accurately determined by a control arrangement located on the loading means. Such an arrangement is shown schematically in FIG. 5 displaced by 90° in the horizontal plane. This takes the form of a fibre-optic system mounted with micro adjustment on the loading means incorporating a light signal emitting device 59 and a light signal receiving device 60. Each component carrier 21 has reflector 61 thereon. In operation, as the component carrier 19 is moved through the loading station the operation of the motor driving the endless chain 15 is terminated when the light signal emitted from the emitter 59 is reflected from the reflector 61 on the carrier 21 to the light signal receiver 60. In this way the stop position of the carrier 21 in the loading station is accurately determined, prior to unloading.

The operation of the apparatus will first be described with reference to the loading of components from a cart into a process machine as in the loading station 1 in FIG. 2.

A loaded cart 5 is wheeled manually into the docking station 36 until the catch 43 engages the latch mechanism at the rear of the docking station. When the cart 5 has reached this position the jacks 40 are then operated by the main motor to lift the cart 5 into the position shown in FIG. 2 into operative engagement with the loading means as shown also in outline, FIG. 9. The motor which drives the endless chains 15 in the cart is automatically connected to the chain drive through a dog clutch arrangement 62. Once the latch arrangement has been triggered the loading sequence is controlled fully automatically by a computerised control system (not shown). As the loading means is moved slightly upwardly the fibre optic sensor detects this and sends a signal to the computer control system to terminate the lifting operation. At this stage, a sensor determines whether the lid 20 on the cart is open or shut and if the lid is shut the loading sequence is terminated.

Assuming the lid 20 is open, the control sequence continues by operating the carrier transport motor to bring a component carrier in the cart into the loading station 19. The precise alignment of the carrier in the loading station is determined by the fibre optic system 59/60/61 which stops rotation of the motor when the component carrier 21 is accurately sligned with the loading means 6. The conveyor 8 then starts rotating and the loading conveyor 49 carrying the transfer finkgers 50 is also started. The two fingers 50 on the endless belt 49 are located equidistantly about the belt 49 and in the normal at-rest position of the belt one of the fingers 50 is poised to engage the components on a carrier 21. This finger is thus caused to move by the belt 49 to engage the last component in the carrier and to push all of the components out of the carrier 21 on to the transfer conveyor 8 from where the components are supplied to the input gate 9 of the machine A. As described previously a counter is located adjacent the conveyor 8 or conveyor 11 to count the number of components being fed from the carrier 21 to the machine.

This information may additionally be used to control the following sequences of the loading operation although the sequences can equally well be triggered by the fact that the finger which has just loaded the transfer conveyor 8 is at a particular position in its constrained path.

The carrier transport motor is then started up again to bring the next component carrier into the loading station 19 for its components to be supplied to the machine. This sequence is repeated until all of the carriers in the cart are empty. The cart is then lowered to the ground by the jacking system for manual removal from the machine.

The apparatus at the unloading station 2 (shown in FIG. 2) is basically similar to the loading station except that the transfer conveyor 11 is located under the endless belt 49 and the transfer fingers 50 as shown in FIG. 9. The cart 5 is raised in the same manner as for the loading station and when property engaged with the loading means 7, the conveyor 11 and endless belt 9 are operated to transfer the components into an empty carrier 21 in the cart 5. The control system includes an arrangement for ensuring that the carrier into which the components are being loaded is empty. Similarly, a fibre optic counter system is provided to count the number of components being received from the machine onto the transfer conveyor 11. In this embodiment, when twenty components have been counted the operation of the endless belt 49 is initiated to push the twenty components into a carrier in the cart 5. It will be appreciated of course that the number of transistors in a carrier may be any appropriate number but in the present embodiment each carrier carries twenty components and there are 150 carriers 21 in a cart so that each cart can accommodate three thousand components.

The provision for the accurate location of the components in the cart with the loading apparatus through the movement permitted in the loading means, the telescopier section in the conveying system and the accurate positioning of the carriers relative to the conveyor system ensures that accurate alignment in all three axes is maintained to provide accurate and reliable transfer of components to and from the carts.

Although described as a cart-to-machine-to-cart arrangement it will be understood that the invention is applicable to a machine-to-cart system, a cart-to-machine and also to a machine-to-cart-to-machine system. In such a system components would be fed from one machine into the cart and subsequently from the cart to a second machine, the control system being arranged to control movement of the carriers in the cart to being empty carriers into cooperative alignment with the first machine and loaded carriers into cooperative alignment with the second machine.

What is claimed is:

1. Apparatus for loading components into a machine, including,
a main frame, a docking station in said main frame, a mobile storage device for said components in the form of a cart moveable into and out of said docking station in said main frame, loading means to transfer said components from the cart to said machine, mounting means for movably mounting the loading means on said main frame, means to bring the loading means and the cart into a cooperative relationship by relative movement therebetween, at least part of the loading means being movable relative to the main frame during said relative movement to align the cart with the loading means in two mutually perpendicular axes,
a plurality of component carriers in the cart, each component carrier being adapted to hold a plurality of said components, each cart having a loading station, and the apparatus having drive means for selectively moving each carrier to said loading station to enable the components in the carrier to be transferred by said loading means from the cart to the machine, the loading means including control means responsive to the position of a carrier in the loading station for controlling the drive means to align the carrier in the loading station with said loading means in an axis perpendicular to said two mutually perpendicular axes.

2. Apparatus according to claim 1, wherein the drive means includes at least one endless drive chain or belt on which the component carriers are removably mounted in spaced parallel relationship.

3. Apparatus according to claim 2 wherein the drive means further comprises a carrier transport motor for moving the component carriers in the cart successively to the loading station, motor mounting means for mounting said carrier transport motor on the main frame, and clutch means engageable when the cart is docked in the docking station to connect the carrier transport motor with said drive means on the cart through which said endless chain or belt is driven by the motor to move the component carriers.

4. Apparatus according to any one of claims 1 to 3 wherein each component carrier is adapted to store linearly a plurality of components and has a base and a guide path defined by guide elements along which the components are movable, the guide elements including two pairs of opposed edge faces laterally spaced in a first plane, each pair having two edge faces a predetermined distance apart in a second plane normal to the first plane to thereby restrain movement of components positioned therebetween in the second plane, a third pair of opposed faces being spaced at a predetermined distance apart in the said first plane, to thereby restrain movement of the components in the first plane.

5. Apparatus according to claim 4, wherein said base comprises spaced base elements formed of aluminium to which the guide elements are secured, the guide elements being formed of stainless steel.

6. Apparatus according to claim 3, in which the cart has a shutter at its loading station biased to a position to block movement of the components out of the cart, the shutter engaging with said loading means when the cart is brought into said cooperative relationship therewith to be moved thereby to a position in which the components can be transferred from the cart.

7. Apparatus according to any one of claims 1 to 3, wherein the docking station has a latch arrangement engageable by the cart when docked to initiate said relative movement between the cart and the loading means, the apparatus further including lifting means for lifting a cart in the docking station into said cooperative relationship with the loading means, the loading means having switch means adapted to terminate said lifting when the loading means is moved relative to the main frame by a predetermined amount by the rising cart engaging herewith.

8. Apparatus according to any one of claims 1 to 3, wherein said control means includes a fibre optice system having a light signal emitted and light signal receiver, and reflector means on each component carrier to reflect a light signal from the emitter onto the receiver when the component carrier is aligned with the loading means, said control means being responsive to reception of said light signal by the receiver to stop the carrier transport motor.

9. Apparatus according to any one of claims 1 to 3, wherein the loading means comprises an endless belt carrying at least one resiliently mounted finger adapted to engage the components in a component carrier in the loading station to transfer the components from the carrier onto a transfer conveyor for transfer to the machine.

10. Apparatus according to claim 9 including detection means for detecting and counting components transferred to the transfer conveyor wherein the detection means comprises a counter, a light source on one side of the path of components onto the transfer conveyor and a light sensitive device on an opposite side, the passage of a component past the detection means interrupting light from the source to the light sensitive device to thereby trigger the counter.

11. Apparatus for loading components into and unloading components from a machine, including,
a main frame, first and second docking stations in said main frame, mobile storage device for said components each in the form of a cart moveable into and out of said docking stations in said main frame, loading means at each station to transfer said components from the cart to said machine and from the machine to the cart respectively, mounting means for movably mounting the loading means on said main frame, means at each docking station to bring the loading means and the cart into a cooperative relationship by relative movement therebetween, at least part of the loading means being movable relative to the main frame during said relative movement to align the cart with the loading means in two mutually perpendicular axes,
a plurality of component carriers in each cart, each component carrier being adapted to hold a plurality of said components, each cart having a loading station, and the apparatus having at each station a drive means for selectively moving each carrier to said loading station to enable the components in the carrier to be transferred by said loading means from one of the carts to the machine and from the machine into an empty carrier in the other cart, the loading means including control means responsive to the position of a carrier in the loading station for controlling the drive means to align the carrier in the loading station with said loading means in an axis perpendicular to said two mutually perpendicular axes.

* * * * *